(12) United States Patent
Osada et al.

(10) Patent No.: US 10,790,169 B2
(45) Date of Patent: Sep. 29, 2020

(54) SUBSTRATE PROCESSING APPARATUS

(71) Applicant: SCREEN Holdings Co., Ltd., Kyoto (JP)

(72) Inventors: Naoyuki Osada, Kyoto (JP); Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 128 days.

(21) Appl. No.: 15/866,576

(22) Filed: Jan. 10, 2018

(65) Prior Publication Data

US 2018/0277398 A1    Sep. 27, 2018

(30) Foreign Application Priority Data

Mar. 24, 2017  (JP) ................... 2017-060047

(51) Int. Cl.
| | |
|---|---|
| H01L 21/67 | (2006.01) |
| B08B 1/04 | (2006.01) |
| H01L 21/306 | (2006.01) |
| H01L 21/304 | (2006.01) |
| H01L 21/027 | (2006.01) |

(52) U.S. Cl.
CPC ............ *H01L 21/6708* (2013.01); *B08B 1/04* (2013.01); *H01L 21/027* (2013.01); *H01L 21/304* (2013.01); *H01L 21/306* (2013.01); *H01L 21/67017* (2013.01); *H01L 21/67028* (2013.01); *H01L 21/67051* (2013.01); *H01L 21/67109* (2013.01); *H01L 21/67248* (2013.01)

(58) Field of Classification Search
CPC ........... H01L 21/6708; H01L 21/67017; H01L 21/67051; H01L 21/67028
See application file for complete search history.

(56) References Cited

U.S. PATENT DOCUMENTS

| | | | | |
|---|---|---|---|---|
| 2009/0056746 | A1* | 3/2009 | Sandhu | B08B 3/02 134/3 |
| 2009/0229641 | A1* | 9/2009 | Yoshida | B08B 3/00 134/107 |
| 2010/0319734 | A1 | 12/2010 | Minami et al. | 134/26 |
| 2011/0259376 | A1* | 10/2011 | Wagener | H01L 21/67051 134/94.1 |
| 2013/0020284 | A1* | 1/2013 | Osada | H01L 21/67028 216/57 |

(Continued)

FOREIGN PATENT DOCUMENTS

| | | |
|---|---|---|
| JP | 2016-063074 A | 4/2016 |
| JP | 2016-152354 A | 8/2016 |

(Continued)

OTHER PUBLICATIONS

KR20120126384A Machine Translation (Year: 2012).*

*Primary Examiner* — Spencer E Bell
(74) *Attorney, Agent, or Firm* — Ostrolenk Faber LLP

(57) ABSTRACT

A discharge port 31 is arranged inside a chamber 9. A circulation flow passage 50 circulates a processing liquid, while maintaining the processing liquid at a predetermined temperature. A discharge flow passage 32 is branched from a circulation flow passage 50 to guide the processing liquid to the discharge port 31. A return flow passage 33 is connected to the discharge flow passage 32 inside the chamber 9 and allows the processing liquid running through the discharge flowpassage 32 to flow back to the circulation flow passage 50.

7 Claims, 6 Drawing Sheets

(56) References Cited

U.S. PATENT DOCUMENTS

| | | |
|---|---|---|
| 2014/0231010 A1 | 8/2014 | Park et al. |
| 2016/0035597 A1* | 2/2016 | Hinode ............ H01L 21/31111 |
| | | 216/84 |
| 2016/0240413 A1 | 8/2016 | Kobayashi et al. |
| 2017/0256426 A1 | 9/2017 | Iwao |

FOREIGN PATENT DOCUMENTS

| | | | |
|---|---|---|---|
| JP | 2016-157854 A | | 9/2016 |
| KR | 20120126384 A | * | 11/2012 |

* cited by examiner

FIG. 1  Discharge stop state

FIG. 3 Suctioning and removing state

SUBSTRATE PROCESSING APPARATUS

BACKGROUND OF THE INVENTION

1. Field of the Invention

The present invention relates to a substrate processing apparatus for processing a substrate. Substrates to be processed include, for example, semiconductor wafers, liquid crystal display device substrates, plasma display substrates, FED (field emission display) substrates, optical disk substrates, magnetic disk substrates, magneto-optical disk substrates, photomask substrates, ceramic substrates, and photovoltaic cell substrates.

2. Description of the Related Art

In a manufacturing process for semiconductor apparatuses, a processing liquid is supplied to a front surface of a substrate of a semiconductor wafer etc., to process the front surface of the substrate by using the processing liquid.

For example, a single substrate processing type substrate processing apparatus which processes one substrate at a time includes a spin chuck that rotates a substrate while horizontally holding the substrate, and a nozzle which includes a discharge port for discharging a processing liquid to an upper surface of the substrate held by the spin chuck. There is a case that a processing liquid which is adjusted for temperature to a high temperature not less than a room temperature may be discharged from the discharge port of the nozzle.

There is known a substrate processing apparatus which includes a processing liquid supplying unit that is provided with a circulation flow passage for circulating a processing liquid, while adjusting a temperature thereof to a predetermined high temperature, a discharge flowpassage which is branched from the circulation flow passage to extend to a discharge port, and a return flow passage which is branched and connected to the discharge flow passage and which allows the processing liquid running through the discharge flowpassage return to the circulation flow passage (refer to, for example, JP2016-157854A and JP2016-152354A). In the above-described conventional substrate processing apparatus, the return flow passage is branched and connected to the discharge flow passage at a predetermined position inside the processing liquid supplying unit.

In a discharge stop state in which no processing liquid is discharged from the discharge port, no processing liquid is circulated at a downstream portion of the discharge flow passage from a connecting position of the discharge flow passage and the return flow passage. Therefore, a pipe wall which constitutes the above-described downstream portion of the discharge flow passage is influenced by a room temperate and lowered in temperature.

In a discharge state in which a processing liquid is discharged from the discharge port, the processing liquid which has been so far circulated through the discharge flow passage, the return flowpassage and the circulation flowpassage is supplied to the discharge port through the downstream portion of the discharge flow passage from the connecting position of the discharge flow passage and the return flow passage.

In the above-described conventional substrate processing apparatus, since the connecting position of the discharge flow passage and the return flow passage is arranged inside the processing liquid supplying unit, the downstream portion of the discharge flow passage from the connecting position of the discharge flow passage and the return flow passage, that is, the portion from the connecting position to the discharge port, is longer in distance. Therefore, in the discharge state, there is a case that a processing liquid which flows through the downstream portion of the discharge flow passage from the connecting position of the discharge flow passage and the return flow passage may be thermally influenced by lowering in temperature on the pipe wall which constitutes the above-described downstream portion, thus resulting in possible discharge of the processing liquid lower in temperature than a desired high temperature from the discharge port.

Thus, an object of the present invention is to provide a substrate processing apparatus which is capable of supplying a processing liquid which is accurately adjusted for temperature to a desired high temperature to a substrate from the start of supplying the processing liquid and also capable of improving uniform processing between substrates, in particular.

SUMMARY OF THE INVENTION

One embodiment of the present invention is to provide a substrate processing apparatus which includes a substrate holding unit for holding a substrate horizontally, a chamber for housing the substrate holding unit, and a processing liquid supplying system which includes a circulation flow passage, a discharge flow passage, a discharge port and a return flow passage to supply a processing liquid to the substrate held by the substrate holding unit, in which the circulation flow passage circulates the processing liquid, while maintaining the processing liquid at a predetermined temperature not less than a normal temperature, the discharge flow passage branched from the circulation flow passage to guide the processing liquid supplied from the circulation flow passage to the discharge port, the discharge port arranged inside the chamber to discharge the processing liquid supplied through the discharge flow passage to the substrate held by the substrate holding unit, and the return flow passage connected to the discharge flow passage inside the chamber, thereby allowing the processing liquid running through the discharge flow passage return to the circulation flow passage.

According to the above-described configuration, for example, in a discharge stop state in which no processing liquid is discharged from the discharge port, the processing liquid is continuously circulated through the discharge flow passage and the return flow passage which is connected to the discharge flow passage inside the chamber, thus making it possible to maintain the processing liquid inside the discharge flow passage at a desired high temperature up to a connecting position of the discharge flow passage and the return flow passage arranged inside the chamber. It is also possible to arrange the connecting position of the discharge flow passage and the return flow passage in the vicinity of the discharge port inside the chamber. In this case, it is possible to shorten a distance of the downstream portion of the discharge flow passage from the connecting position of the discharge flow passage and the return flow passage, that is, from the connecting position of the discharge flow passage and the return flow passage to the discharge port. Therefore, in the discharge state, a processing liquid flowing through the downstream portion of the discharge flow passage from the connecting position of the discharge flow passage and the return flow passage can be made less susceptible to thermal effects in association with lowering in temperature on the pipe wall which constitutes the downstream portion. Consequently, it is possible to supply the processing liquid which is accurately adjusted for temperature to a desired high temperature to a substrate from the start of supplying the processing liquid and thereby possible to improve uniform processing between the substrates.

In a conventional substrate processing apparatus, there is a case that, prior to discharge of an actual processing liquid, a predispensing process is executed in which a processing liquid adjusted for temperature to a desired high temperature is supplied to a discharge flow passage and discharged from a discharge port. However, according to the above-described configuration, it is possible to suppress the extension of processing time resulting from execution of the predispensing process and an increase in consumption of the processing liquid by omitting the predispensing process, shortening time for discharging the processing liquid in the predispensing process or decreasing an amount of the processing liquid to be discharged.

In one embodiment of the present invention, the discharge port is arranged inside the chamber above a substrate held by the substrate holding unit and in-plane of the substrate in a planar view, and the return flow passage is connected to the discharge flowpassage inside the chamber above the substrate and in-plane of the substrate in a planar view.

According to the above-described configuration, where the discharge port is arranged inside the chamber above the substrate and in-plane of the substrate in a planar view, the return flow passage is connected to the discharge flow passage inside the chamber above the substrate and in-plane of the substrate in a planar view, by which a connecting position of the discharge flow passage and the return flow passage can be arranged so as to be closer to the discharge port. Then, in this case, it is possible to shorten a distance of the downstream portion of the discharge flow passage from the connecting position of the discharge flow passage and the return flow passage. Therefore, a processing liquid running through the downstream portion of the discharge flow passage from the connecting position of the discharge flow passage and the return flow passage can be made less susceptible to thermal effects in association with lowering in temperature on the pipe wall which constitutes the downstream portion. Consequently, it is possible to supply the processing liquid which is more accurately adjusted for temperature to a desired high temperature to the substrate from the start of supplying the processing liquid and thereby possible to further improve uniform processing between the substrates.

In one embodiment of the present invention, the processing liquid supplying system further includes a discharge heater. The discharge heater is placed on the discharge flow passage at an upstream position from the connecting position of the discharge flow passage and the return flow passage to heat a processing liquid flowing through the discharge flow passage.

According to the above-described configuration, a processing liquid branched from the circulation flow passage and flowing through the discharge flow passage can be adjusted for temperature up to a desired discharge temperature by the discharge heater at an upstream position from the connecting position of the discharge flow passage and the return flow passage. Therefore, the processing liquid flowing through the downstream portion of the discharge flow passage from the connecting position of the discharge flow passage and the return flow passage can be made less susceptible to thermal effects in association with lowering in temperature on the pipe wall which constitutes the downstream portion. Consequently, it is possible to supply the processing liquid which is more accurately adjusted for temperature to a desired high temperature to a substrate from the start of supplying the processing liquid and thereby possible to further improve uniform processing between the substrates.

In one embodiment of the present invention, the processing liquid supplying system includes the plurality of discharge flow passages branched from the circulation flow passage, the plurality of discharge ports installed for each of the plurality of discharge flow passages, and the plurality of return flow passages connected individually inside the chamber to each of the plurality of discharge flow passages.

According to the above-described configuration, since a plurality of connecting positions of the discharge flow passages and the return flow passages are each arranged inside the chamber, it is possible to shorten a distance of the downstream portion each of the discharge flow passages from each connecting position of the discharge flow passages and the return flow passages. Therefore, a processing liquid running through the downstream portion of the discharge flow passages from each connecting position of the discharge flow passages and the return flow passages can be made less susceptible to thermal effects in association with lowering in temperature on the pipe wall which constitutes the downstream portions. It is possible to supply a processing liquid accurately adjusted for temperature to a desired high temperature to a substrate from each of the discharge ports. It is, thereby, possible to reduce a variation in temperature of the processing liquid flowing through each of the discharge flow passages and, in this case, possible to improve the uniformity of temperature of the processing liquid discharged from the plurality of discharge ports. Therefore, it is possible to improve uniform processing in-plane of the same substrate.

In one embodiment of the present invention, the substrate holding unit rotates the substrate around a vertical rotation axis passing through a central portion of the substrate, and the plurality of discharge ports are individually arranged inside the chamber and at a plurality of positions different in distance from the rotation axis in an upper surface of the substrate.

According to the above-described configuration, while the substrate is rotated around the rotation axis, a processing liquid discharged from the plurality of discharge ports is placed at the plurality of positions different in distance from the rotation axis, thus making it possible to feed smoothly the processing liquid which is accurately adjusted for temperature to a desired high temperature to an entire area of the upper surface of the substrate. Therefore, it is possible to further improve uniform processing in-plane of the same substrate.

In one embodiment of the present invention, the processing liquid supplying system further includes a short-circuit flow passage. The short-circuit flow passage is connected to the discharge flow passage at an upstream position from the connecting position of the discharge flow passage and the return flow passage and connected to the return flow passage. The processing liquid supplying system further includes an opening/closing unit which opens and closes the short-circuit flow passage.

According to the above-described configuration, for example, in the discharge stop state, the short-circuit flow passage is opened by the opening/closing unit to short-circuit the discharge flow passage and the return flow passage, thereby, while the processing liquid is continuously circulated through the discharge flow passage, the short-circuit flow passage and the return flow passage, a processing liquid running through the downstream portion of the discharge flow passage from the connecting position of the discharge flow passage and the short-circuit flowpassage is stopped and, there can be executed, for example, a suck back process which will be described hereinafter.

In one embodiment of the present invention, the processing liquid supplying system further includes a suction flow passage. The suction flow passage is connected to the return flow passage at a downstream position from the connecting position of the return flow passage and the discharge flow passage and an upstream position from the connecting position of the return flow passage and the short-circuit flow passage, thereby transmitting a suction force through the return flow passage to a downstream region of the discharge flow passage from the connecting position of the discharge flow passage and the return flow passage.

According to the configuration, for example, as described above, in the discharge stop state, while the processing liquid is continuously circulated through the discharge flow passage, the short-circuit flow passage and the return flow passage, a suction force is transmitted from the suction flow passage to a downstream region of the discharge flow passage from the connecting position of the discharge flow passage and the return flow passage through the return flow passage, thus making it possible to suck and remove (suck back) a processing liquid remaining at the region into the suction flow passage.

Therefore, it is possible to prevent the processing liquid which remains at a downstream region of the discharge flow passage from the connecting position of the discharge flow passage and the return flow passage and which is lowered in temperature from being accidentally supplied from the discharge port to the upper surface of the substrate in a discharge stop state. Further, a processing liquid which is accurately adjusted for temperature to a desired high temperature can be supplied to the substrate through the discharge flow passage upon restarting of discharge of the processing liquid. Consequently, it is possible to further improve uniform processing between the substrates.

In one embodiment of the present invention, the processing liquid supplying system further includes a switching unit. The switching unit switches to any of a plurality of states including a discharge state in which a processing liquid supplied from the circulation flow passage to the discharge flow passage is supplied to the discharge port and a discharge stop state in which the processing liquid supplied from the circulation flow passage to the discharge flow passage is supplied to the return flow passage.

According to the above-described configuration, the processing liquid supplying system can be switched smoothly by the switching unit between a discharge state in which a processing liquid is discharged from the discharge port through the circulation flow passage and the discharge flow passage and a discharge stop state in which the processing liquid is not discharged from the discharge port by circulation through the circulation flow passage, the discharge flow passage and the return flow passage. Therefore, it is possible to supply the processing liquid which is accurately adjusted for temperature to a desired high temperature to a substrate from the start of supplying the processing liquid and also possible to further improve uniform processing between the substrates.

In one embodiment of the present invention, the switching unit switches to a suctioning and removing state in which in a state that the short-circuit flow passage is opened by the opening/closing unit to short-circuit and connect the discharge flow passage to the return flow passage through the short-circuit flow passage, a suction force is transmitted to a downstream region of the discharge flow passage from a connecting position of the discharge flow passage and the return flow passage through the suction flow passage and the return flow passage, and the processing liquid inside the region is sucked and removed into the suction flow passage.

According to the above-described configuration, the processing liquid supplying system can be smoothly switched by the switching unit between the discharge stop state, the discharge state and the suctioning and removing state. Consequently, it is possible to supply the processing liquid which is accurately adjusted for temperature to a desired high temperature to a substrate, while preventing the processing liquid lowered in temperature from being accidentally supplied to an upper surface of the substrate from the discharge port and also to further improve uniform processing between the substrates.

The above and other elements, features, steps characteristics and advantages of the present invention will become more apparent from the following detailed description of the preferred embodiments with reference to the attached drawings.

DETAILED DESCRIPTION OF THE PREFERRED EMBODIMENTS

Figure 1:
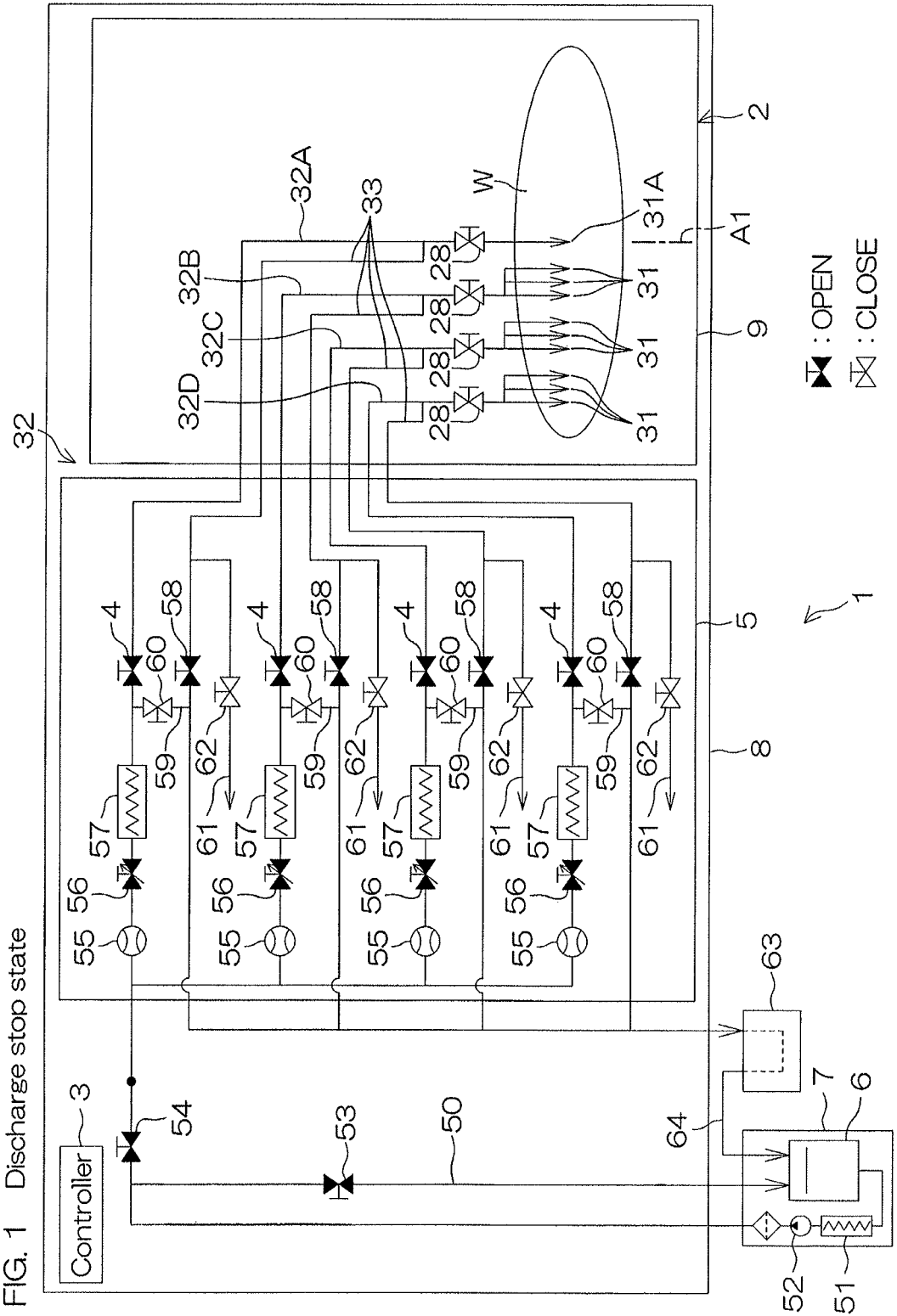
FIG. 1 is a schematic view which shows a processing liquid supplying system of a discharge stop state of a substrate processing apparatus according to a preferred embodiment of the present invention.
Figure 2:
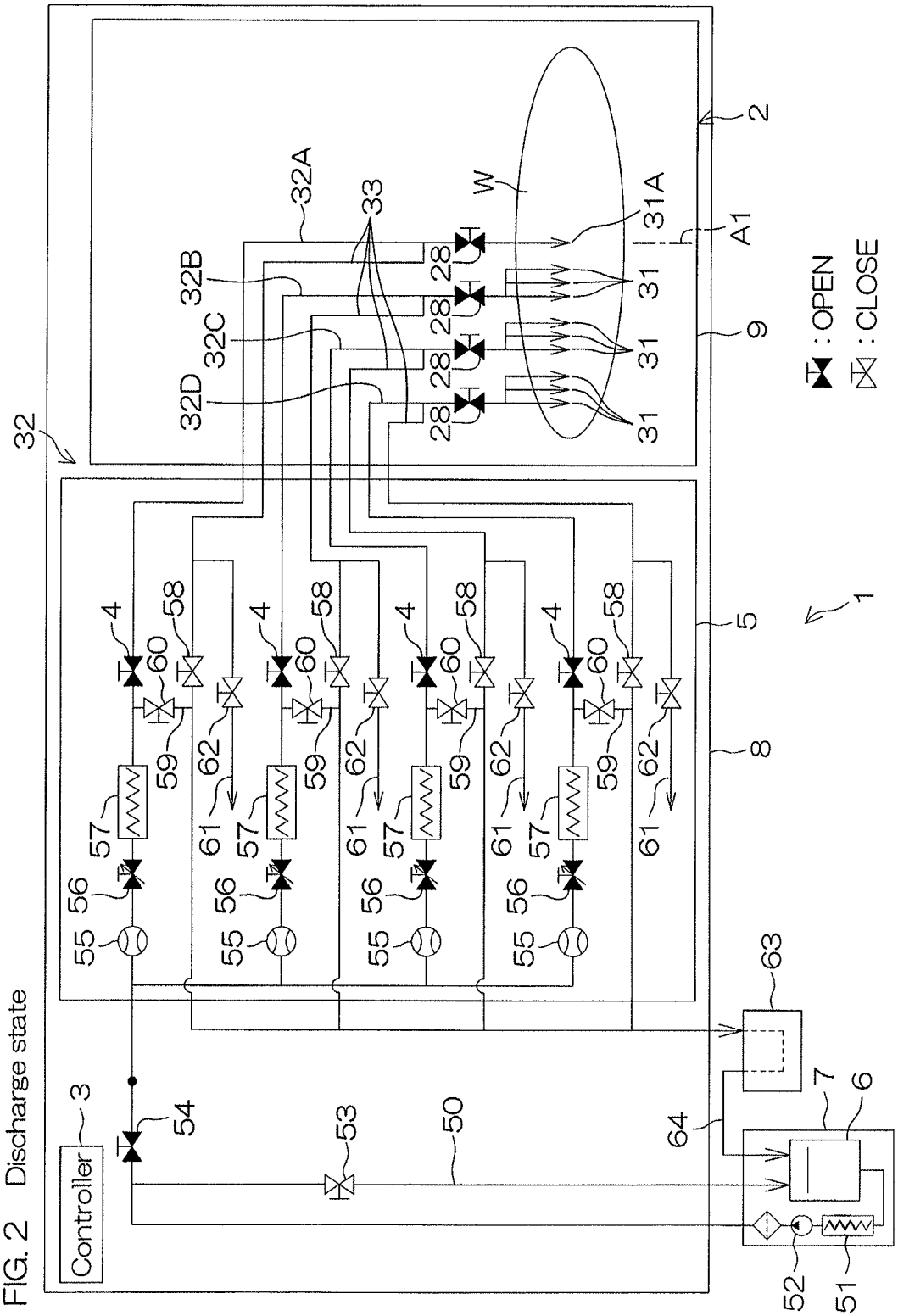
FIG. 2 is a schematic view which shows the processing liquid supplying system of a discharge state of the substrate processing apparatus of FIG. 1.
Figure 3:
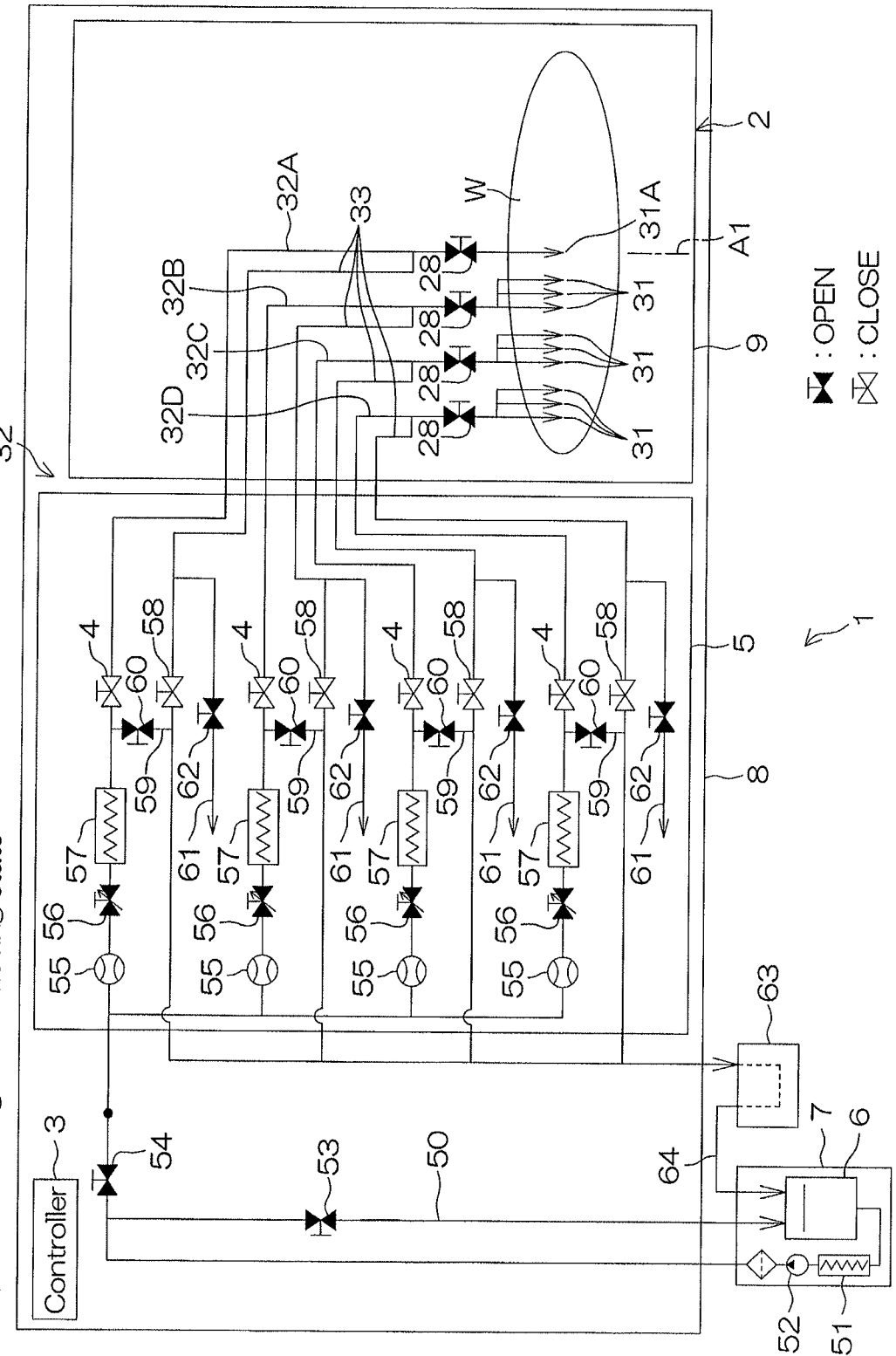
FIG. 3 is a schematic view which shows the processing liquid supplying system of a suctioning and removing state of the substrate processing apparatus of FIG. 1.

FIG. 1 to FIG. 3 is a schematic view which shows a processing liquid supplying system of a substrate processing apparatus 1 according to a first preferred embodiment of the present invention. FIG. 1 shows the processing liquid supplying system in a discharge stop state, FIG. 2 shows the processing liquid supplying system in a discharge state, and FIG. 3 shows the processing liquid supplying system in a suctioning and removing state.

The substrate processing apparatus 1 is a single substrate processing type apparatus which processes disk-shaped substrates W such as semiconductor wafers one by one. The substrate processing apparatus 1 includes a processing unit 2 for processing the substrate W by a processing liquid, a transfer robot (not illustrated) which transfers the substrate W to the processing unit 2, and a controller 3 for controlling the substrate processing apparatus 1. The controller 3 is a computer including a computing portion and a storage portion.

The substrate processing apparatus 1 includes a fluid box 5 which houses fluid devices such as a supply valve 4 for controlling the supply and supply stoppage of a processing liquid to the processing unit 2, and a storage box 7 for housing a tank 6 which stores the processing liquid supplied through the fluid box 5 to the processing unit 2. The processing unit 2 and the fluid box 5 are arranged inside a frame 8 of the substrate processing apparatus 1. The processing unit 2 is provided with a chamber 9, and the chamber 9 and the fluid box 5 are arrayed in a horizontal direction. The storage box 7 is arranged outside the frame 8. The storage box 7 may be arranged inside the frame 8.

Figure 4:
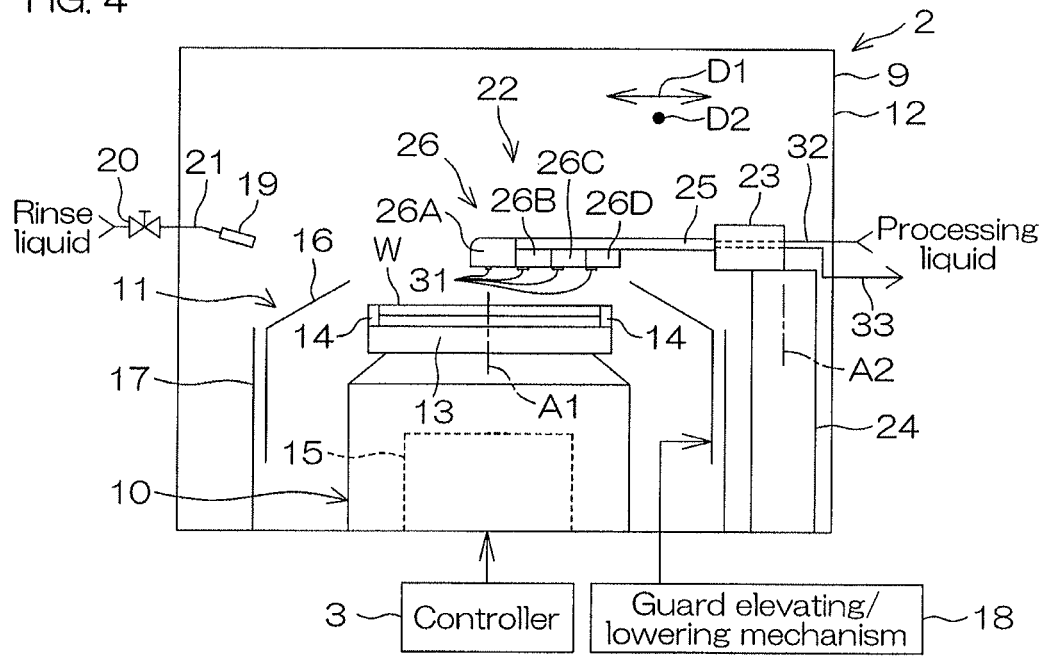
FIG. 4 is a schematic front view which shows an interior of a processing unit provided at the substrate processing apparatus.
Figure 5:
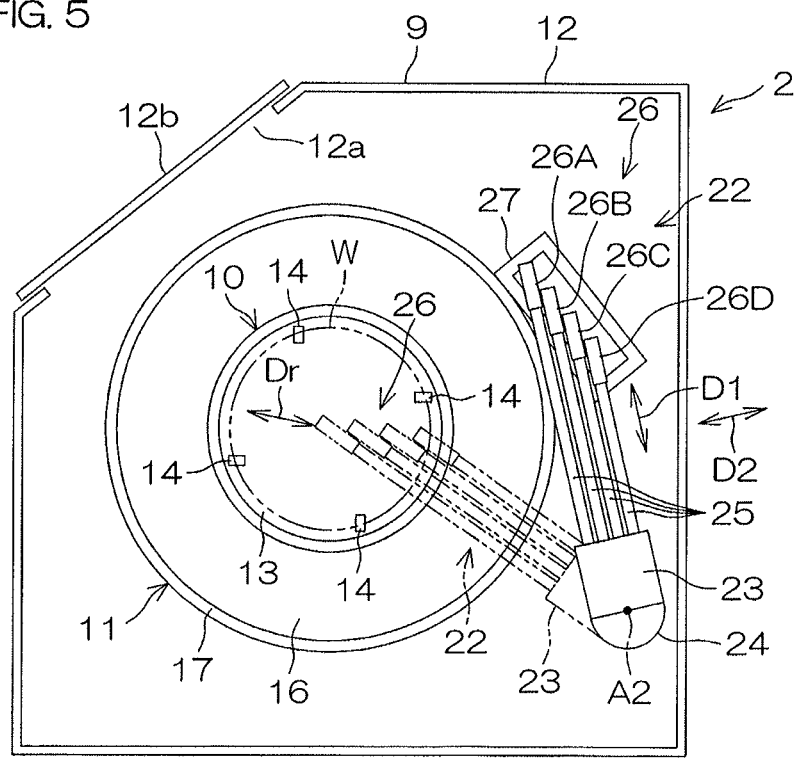
FIG. 5 is a schematic plan view which shows the interior of the processing unit of FIG. 4.

FIG. 4 is a schematic front view which shows an interior of the processing unit 2 provided at the substrate processing apparatus 1. FIG. 5 is a schematic plan view which shows the interior of the processing unit 2 of FIG. 4.

The processing unit 2 includes the chamber 9, a spin chuck 10 which rotates the substrate W around a vertical rotation axis A1 passing through a central portion of the substrate W while holding the substrate W horizontally inside the chamber 9, and a cylindrical cup 11 for receiving a processing liquid expelled from the substrate W. The spin chuck 10 is one example of the substrate holding unit which holds the substrate W horizontally.

The chamber 9 includes a box-shaped partition wall 12 having a carry-in/carry-out port 12*a* through which the substrate W passes, and a shutter 12*b* for opening and closing the carry-in/carry-out port 12*a*. The shutter 12*b* is able to move between an open position at which the carry-in/carry-out port 12*a* is opened and a close position (position shown in FIG. 5) at which the carry-in/carry-out port 12*a* is closed with respect to the partition wall 12. A transfer robot which is not shown in the drawing carries the substrate W in the chamber 9 through the carry-in/carry-out port 12*a* and caries out the substrate W from the chamber 9 through the carry-in/carry-out port 12*a*.

The spin chuck 10 includes a disk-shaped spin base 13 which is held in a horizontal posture and a plurality of chuck pins 14 which hold the substrate W in a horizontal posture above the spin base 13. The spin chuck 10 further includes a spin motor 15 which rotates the substrate W around the rotation axis A1 by rotating the plurality of chuck pins 14. The spin chuck 10 is not limited to a clamping type chuck which allows the plurality of chuck pins 14 to be in contact with a peripheral end surface of the substrate W. The spin chuck 10 may be a vacuum type chuck which holds the substrate W horizontally by allowing a rear surface (lower surface) of the substrate W which is a non-device forming surface is suctioned onto the upper surface of the spin base 13.

The cup 11 includes a cylindrical splash guard 16 which surrounds the spin chuck 10 around the rotation axis A1 and a cylindrical outer wall 17 which surrounds the splash guard 16 around the rotation axis A1. The processing unit 2 includes a guard elevating/lowering mechanism 18 which elevates and lowers the splash guard 16 vertically. The guard elevating/lowering mechanism 18 elevates and lowers the splash guard 16 between an upper position at which an upper end of the splash guard 16 is positioned above a position of the substrate W held by the spin chuck 10 (position shown in FIG. 4) and a lower position at which the upper end of the splash guard 16 is positioned below the position of the substrate W held by the spin chuck 10.

The processing unit 2 includes a rinse liquid nozzle 19 which discharges a rinse liquid downward toward an upper surface of the substrate W held by the spin chuck 10. The rinse liquid nozzle 19 is connected to rinse liquid piping 21 on which a rinse liquid valve 20 is placed. The processing unit 2 may be provided with a nozzle movement unit which moves the rinse liquid nozzle 19 between a processing position and a stand-by position.

When the rinse liquid valve 20 is opened, the rinse liquid is supplied from the rinse liquid piping 21 to the rinse liquid nozzle 19 and discharged from the rinse liquid nozzle 19. The rinse liquid is, for example, pure water (deionized water). The rinse liquid is not limited to pure water but may also be any one of carbonated water, electrolytic ion water, hydrogen water, ozone water and hydrochloric acid water with a diluted concentration (for example, approximately 10 to 100 ppm).

The processing unit 2 includes a plurality of nozzles 22 which discharge a processing liquid (chemical liquid) downward and a holder 23 which holds each of the plurality of nozzles 22. The processing unit 2 further includes a nozzle movement unit 24 which moves the holder 23, thereby moving the plurality of nozzles 22 between a processing position (the position shown by the double dotted and dashed line in FIG. 5) and a stand-by position (the position shown by the solid line in FIG. 5).

A typical example of the processing liquid includes an etching liquid such as TMAH (tetramethylammonium hydroxide, etc.) and a photoresist removing liquid such as SPM (sulfuric acid/hydrogen peroxide mixture). The processing liquid is not limited to TMAH or SPM but may be a liquid which includes at least any one of sulfuric acid, acetic acid, nitric acid, hydrochloric acid, hydrofluoric acid, ammonia water, hydrogen peroxide water, an organic acid (for example, citric acid, oxalic acid, etc.), an organic alkali other than TMAH, a surfactant and a corrosion inhibitor.

Each of the nozzles 22 includes an arm 25 which is supported in a cantilevered manner by the holder 23 to extend from the holder 23 in a horizontally longitudinal direction D1 and a nozzle head 26 (a first nozzle head 26A, a second nozzle head 26B, a third nozzle head 26C and a fourth nozzle head 26D) connected to a leading end of each of the arms 25.

The plurality of arms 25 are arrayed sequentially from the first nozzle head 26A to the fourth nozzle head 26D in a horizontally arrayed direction D2 orthogonal to the longitudinal direction D1. The plurality of arms 25 are arranged so as to be equal in height. A clearance between two arms 25 adjacent in the arrayed direction D2 may be equal to any clearance between other two arms or may be different from at least one clearance between other two arms. FIG. 5 shows an example in which the plurality of arms 25 are arranged so as to be equal in clearance.

The plurality of arms 25 are arrayed from the first nozzle head 26A to the fourth nozzle head 26D in decreasing order of length in the longitudinal direction D1. The plurality of nozzle heads 26 deviate in the longitudinal direction D1 so as to be arrayed sequentially from the first nozzle head 26A to the fourth nozzle head 26D in terms of the longitudinal direction D1. The plurality of nozzle heads 26 are arrayed linearly in a planar view.

The nozzle movement unit 2 allows the holder 23 to move rotationally around a nozzle rotational movement axis A2 extending vertically around the cup 11, thereby moving the plurality of nozzles 22 along an arc shaped route which passes through the substrate W in a planar view. Thereby, the plurality of nozzles 22 move horizontally between a processing position and a stand-by position. The processing unit 2 includes a cylindrical bottomed stand-by pot 27 arranged below the stand-by positions of the plurality of nozzles 22. The stand-by pot 27 is arranged around the cup 11 in a planar view.

The processing position is a position at which a processing liquid discharged from the plurality of nozzles 22 lands on the upper surface of the substrate W. At the processing position, the nozzle heads 26 of the plurality of nozzles 22 overlap the substrate W in a planar view, and the plurality of nozzle heads 26 are arrayed sequentially from the first nozzle head 26A to the fourth nozzle head 26D in a radial direction Dr from the rotation axis A1 side in a planar view. At this time, the first nozzle head 26A overlaps a central portion of the substrate W in a planar view and the fourth nozzle head 26D overlaps a circumferential edge portion of the substrate W in a planar view.

The stand-by position is a position at which the plurality of nozzle heads 26 are retracted so that the plurality of nozzle heads 26 do not overlap the substrate W in a planar view. In the stand-by position, the plurality of nozzle heads 26 are positioned outside the cup 11 so as to be along an outer circumferential surface of the cup 11 (outer circumferential surface of the outer wall 17) in a planar view, and arrayed sequentially from the first nozzle head 26A to the fourth nozzle head 26D in a circumferential direction (direction around the rotation axis A1). The plurality of nozzle heads 26 are arranged sequentially from the first nozzle head 26A to the fourth nozzle head 26D so as to become more distant from the rotation axis A1.

In the following description, there is a case that "first" and "A" may be respectively added to the beginning and the end of a configuration corresponding to the first nozzle head 26A. There is, for example, a case that a discharge flow passage 32 corresponding to the first nozzle head 26A may be given as a "first discharge flow passage 32A" or a "discharge flow passage 32A." The same is applied to configurations corresponding to the second nozzle head 26B to the fourth nozzle head 26D.

Figure 6:
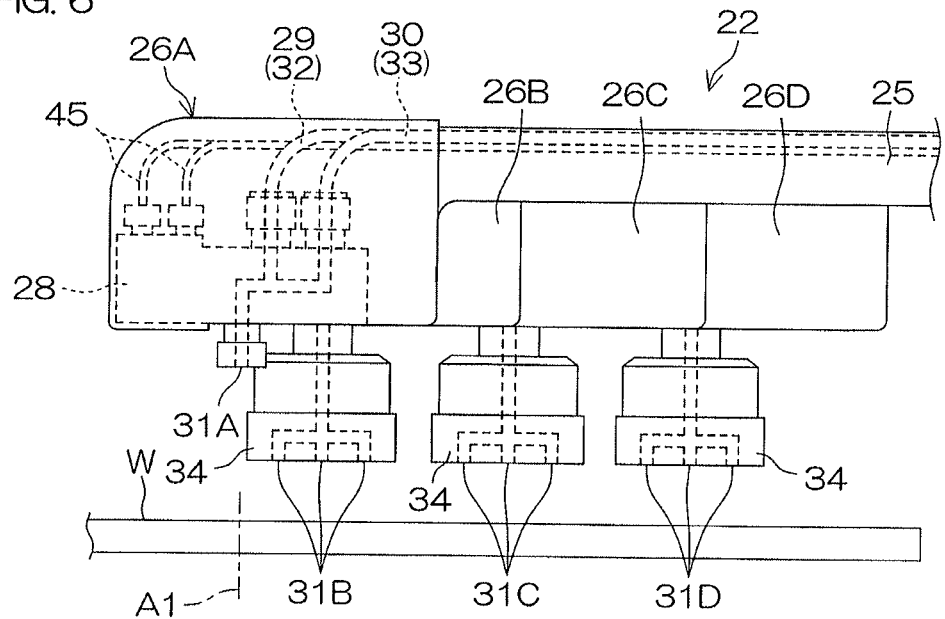
FIG. 6 is a schematic front view which shows a plurality of nozzles.
Figure 7:
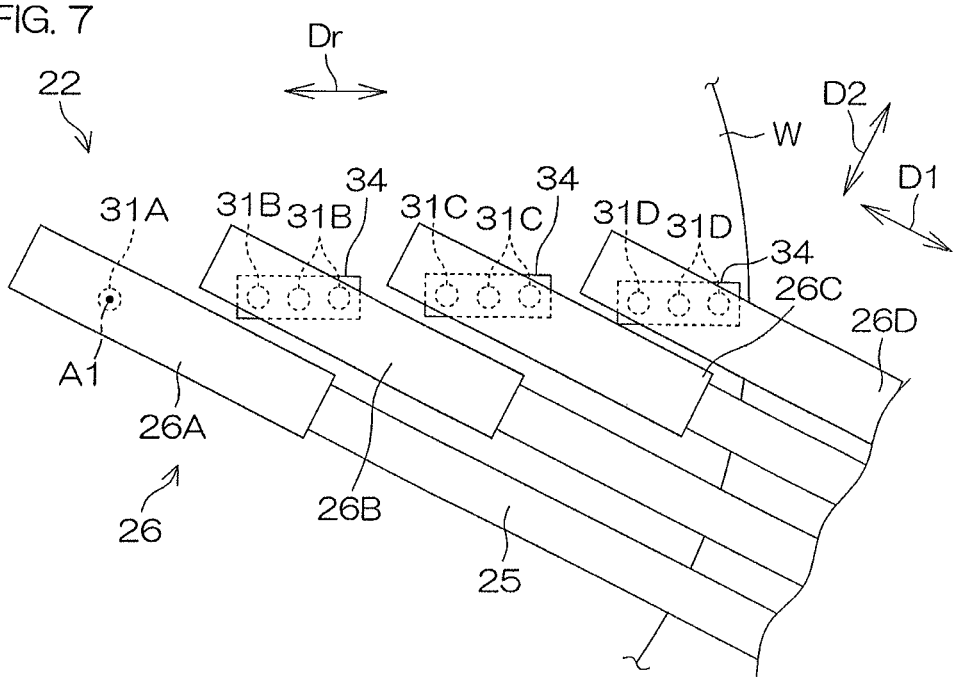
FIG. 7 is a schematic plan view which shows the nozzles in FIG. 6.

FIG. 6 is a schematic front view which shows the plurality of nozzles 22. FIG. 7 is a schematic plan view which shows the nozzles 22 in FIG. 6.

It is noted that in FIG. 6, of the nozzle heads 26 of the plurality of nozzles 22, only the interior of the first nozzle head 26A is given in detail. The interior of each of the nozzle heads 26 other than the first nozzle head 26A is also similar in configuration. Common portions of the individual nozzle heads 26 will be described with reference to the first nozzle head 26A.

The nozzle 22 includes the arm 25, the nozzle head 26 and a discharge valve 28. The discharge valve 28 is installed inside the nozzle head 26. Two tubes 29, 30 are connected to the discharge valve 28. Each of the tubes 29, 30 forms a flow passage for guiding a processing liquid.

One discharge port 31A, the leading end of which is opened on a lower surface of the first nozzle head 26A, is formed at the discharge valve 28 of the first nozzle head 26A. The flow passages of tubes 29, 30 are connected to each other inside the discharge valve 28 and opened at the discharge port 31A.

A base 34 is connected to the discharge valve 28 of each of the nozzle heads 26 other than the first nozzle head 26A. The base 34 forms a plurality of flow passages for guiding a processing liquid. The plurality of flow passages on the base 34 form a plurality of discharge ports 31 opened on a lower surface of each of the nozzle heads 26.

A flow passage extending from the tube 29 to each of the discharge ports 31 corresponds to a part of the discharge flow passage 32 for guiding a processing liquid supplied from the tank 6 to the discharge port 31. A flow passage which is branched from the discharge flow passage 32 inside the discharge valve 28 and leads to the tube 30 corresponds to a part of the return flow passage 33 which allows the processing liquid running through the discharge flow passage 32 to flow back to the tank 6. Each of the discharge ports 31 is arranged at each of a plurality of positions different in distance from the rotation axis A1.

FIG. 6 and FIG. 7 each show an example in which a total of the ten discharge ports 31 are installed at the plurality of nozzles 22. The first nozzle head 26A includes one discharge port 31A. The nozzle heads 26 other than the first nozzle head 26A each include three discharge ports 31 installed on the base 34. The three discharge ports 31 installed on the same base 34 are constituted with an inner discharge port which is closest to the rotation axis A1, of the three discharge ports 31, an outer discharge port which is farthest from the rotation axis A1, of the three discharge ports 31, and an intermediate discharge port which is arranged between the inner discharge port and the outer discharge port.

As shown in FIG. 7, the plurality of discharge ports 31 are arrayed approximately linearly in a planar view. A clearance between two discharge ports 31 on both ends is equal to or shorter than a radius of the substrate W. A clearance between two adjacent discharge ports 31 may be equal to any clearance between other two ports or may be different from at least one clearance between other two ports. Further, the plurality of discharge ports 31 may be arranged so as to be different in height at two or more levels or they may be arranged so as to be equal in height.

When the plurality of nozzle heads 26 are arranged at the processing position, the plurality of discharge ports 31 are individually arranged at a plurality of positions different in distance from the rotation axis A1 (shortest distance in a planar view). At this time, the plurality of discharge ports 31 are individually arranged above the substrate W and also in-plane of the substrate W in a planar view. That is, of the plurality of discharge ports 31, the innermost discharge port (the first discharge port 31A) which is closest to the rotation axis A1 is arranged above at the central portion of the substrate W and, of the plurality of discharge ports 31, the outermost discharge port (the fourth discharge port 31D) which is farthest from the rotation axis A1 is arranged above at the circumferential edge portion of the substrate W. The plurality of discharge ports 31 are arrayed along the radial direction Dr1 in a planar view.

The first discharge port 31A installed at the first nozzle head 26A is a discharge port which discharges a processing liquid at the central portion of the upper surface of the substrate W. The second discharge port 31B to the fourth discharge port 31D installed at each of the nozzle heads 26 other than the first nozzle head 26A are a plurality of discharge ports which discharge a processing liquid toward portions on the upper surface of the substrate W other than the central portion.

Each of the discharge ports 31 discharges a processing liquid to the upper surface of the substrate W in a vertical discharge direction. The plurality of discharge ports 31 discharge the processing liquid to a plurality of positions within the upper surface of the substrate W at which the liquid reaches. The plurality of positions at which the liquid reaches are various positions different in distance from the rotation axis A1.

Figure 8:
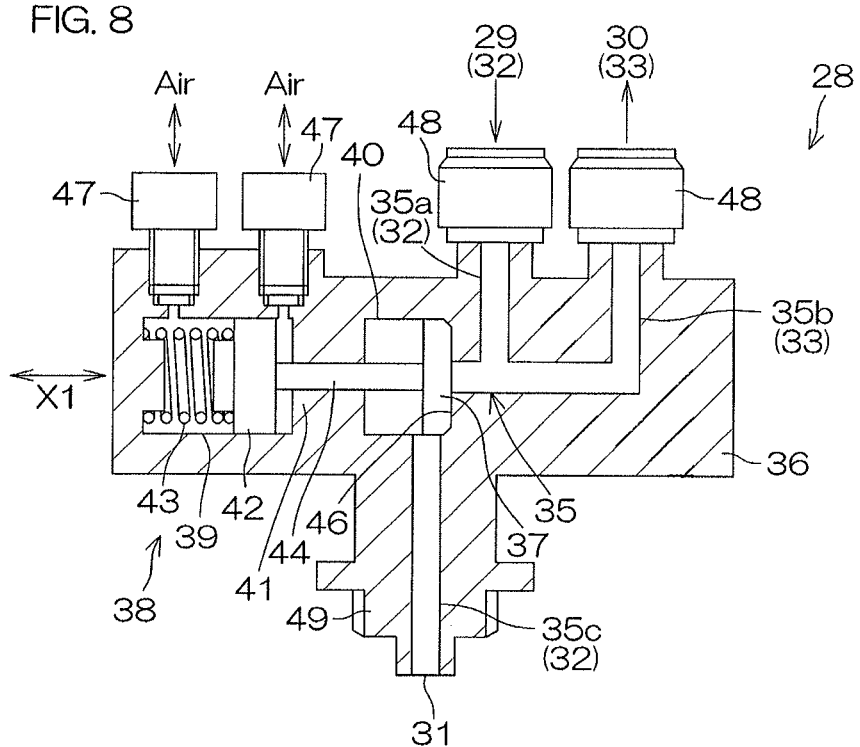
FIG. 8 is a cross sectional view which shows an interior of an example of a discharge valve incorporated into the nozzle in FIG. 6.

FIG. 8 is a cross sectional view which shows an interior of an example of a discharge valve incorporated into the nozzle in FIG. 6.

The discharge valve 28 includes a main body 36 in which a flowpassage 35 is formed for guiding a processing liquid, a valve body 37 which opens and closes the flow passage 35, a pneumatic actuator 38 which allows the valve body 37 to move back and forth in an axial direction X1, thereby opening and closing the flow passage 35, and a discharge port 31.

The main body 36 includes a cylinder 39 which constitutes the pneumatic actuator 38, a valve chest 40 which allows the valve body 37 to move back and forth, and a flow passage 35a which is communicatively connected to the tube 29 to reach the valve chest 40. The main body 36 includes a flow passage 35b which is communicatively connected to the tube 30 connected to the flow passage 35a at a position upstream from the valve chest 40 on the flow passage 35a, and a flow passage 35c which extends from the valve chest 40 to the discharge port 31. The cylinder 39 and the valve chest 40 are arrayed along the axial direction X1. A space between the cylinder 39 and the valve chest 40 is separated by a partition wall 41. The tube 29, the flow passage 35a and the flow passage 35c correspond to a part of the discharge flowpassage 32 for guiding a processing liquid supplied from the tank 6 to the discharge port 31. Further, the flow passage 35b and the tube 30 correspond to a part of the return flow passage 33 which allows the processing liquid running through the discharge flow passage 32 to flow back to the tank 6.

The pneumatic actuator 38 includes the cylinder 39, a piston 42, a spring 43 and a rod 44. The cylinder 39 is divided by the piston 42 into an anterior chamber on the partition wall 41 side and a posterior chamber opposite the axial direction X1 in relation to the piston 42. Joints 47 for connecting the tubes (tubes 45 in FIG. 6) to transmit air pressure to each of the anterior chamber and the posterior chamber of the cylinder 39 are connected individually to the main body 36. The piston 42 transmits air pressure through the tube 45 and the joint 47 to one of the anterior chamber and the posterior chamber of the cylinder 39, thereby moving back and forth inside the cylinder 39 along the axial direction X1.

The spring 43 is inserted between the piston 42 and the main body 36 on the posterior chamber side of the cylinder 39, pressing the piston 42 to the partition wall 41 direction.

The rod 44 is such that a base portion thereof is coupled to the piston 42 and a leading end portion thereof penetrates through the partition wall 41 and protrudes on the valve chest 40. The valve body 37 is coupled to the leading end portion of the rod 44 which protrudes on the valve chest 40. The valve body 37 is formed in a disk-shape and coupled to the leading end portion of the rod 44 so that a radial direction thereof is orthogonal to the axial direction X1. When the piston 42 moves back and forth inside the cylinder 39 along the axial direction X1, the valve body 37 moves back and forth via the rod 44 inside the valve chest 40 along the axial direction X1.

The valve chest 40 includes a circular valve seat surface 46 which opposes the partition wall 41 and is orthogonal to the axial direction X1, and the flow passage 35a is concentrically opened at the center of the valve seat surface 46. The flow passage 35c is opened laterally on the valve chest 40 in a direction at which the valve body 37 moves back and forth (axial direction X1).

The tube 29, the flow passage 35a, the tube 30 and the flow passage 35b are connected to each other via joints 48.

The main body 36 includes a cylindrical portion 49 which is provided with a discharge port 31 at the leading end thereof and protrudes downward from the lower surface of the nozzle head 26. At each of the nozzle heads 26 other than the first nozzle head 26A, although not shown in the drawing, the base 34 having a plurality of flow passages for guiding a processing liquid is connected to the cylindrical portion 49 and the plurality of flow passages on the base 34 are opened on a lower surface of the base 34 to form the plurality of discharge ports 31.

A portion of the discharge valve 28 in contact with a processing liquid (liquid contact portion) is made of a material resistant to the processing liquid (for example, synthetic resin such as fluorine-based resin) or coated with a film of a material resistant to the processing liquid. An inner surface of the flow passage 35 and that of the valve chest 40 or an outer surface of the valve body 37 and that of the rod 44 are included in the liquid contact portion.

In a state that no air pressure is applied to the anterior chamber or the posterior chamber of the cylinder 39 and the pneumatic actuator 38 is not actuated, the piston 42 is pressed by the spring 43 to a forward movement position inside the cylinder 39, that is, a position which comes close to the partition wall 41 side as shown in FIG. 8. Thereby, the valve body 37 is brought into contact with the valve seat surface 46 inside the valve chest 40 to close the opening of the flow passage 35a. Therefore, the connection between the flow passage 35a and the flow passage 35c is closed, by which a processing liquid supplied from the tank 6 through the tube 29 and the flow passage 35a is allowed to flow back to the tank 6 through the flow passage 35b and the tube 30 (discharge stop state).

In the discharge stop state, air pressure is transmitted to the anterior chamber of the cylinder 39 to move the piston 42 backward in the posterior chamber direction of the cylinder 39 against a pressing force of the spring 43. Thereby, the valve body 37 moves away from the valve seat surface 46 inside the valve chest 40, and the opening of the flow passage 35a is opened on the valve chest 40. Therefore, the flow passage 35a and the flow passage 35c are connected to each other through the valve chest 40, and a processing liquid supplied from the tank 6 through the tube 29 and the flow passage 35a is discharged from the flow passage 35c through the discharge port 31 (discharge state).

In the discharge state, air pressure transmitted to the anterior chamber of the cylinder 39 is stopped and, instead, the air pressure is transmitted to the posterior chamber of the cylinder 39. And, the piston 42 is allowed to move forward together with a pressing force of the spring 43 in the anterior chamber direction of the cylinder 39, that is, a direction close to the partition wall 41. Then, the valve body 37 comes into contact with the valve seat surface 46 inside the valve chest 40, and the opening of the flow passage 35a is closed. Therefore, the state is returned to a discharge stop state in which the connection between the flow passage 35a and the flow passage 35c is closed and the processing liquid supplied from the tank 6 through the tube 29 and the flow passage 35a is allowed to flow back to the tank 6 through the flow passage 35b and the tube 30.

It is noted that the discharge valve 28 may be a solenoid valve or a valve of any other type.

Next, a detailed description will be given of the processing liquid supplying system with reference to FIG. 1 to FIG. 3. In the following description, the temperature of processing liquid heated by a circulation heater 51 may be referred to as a circulation temperature, and the temperature of processing liquid heated by a discharge heater 57 may be referred to as a discharge temperature.

The processing liquid supplying system includes the tank 6 which stores a processing liquid and the circulation flow passage 50 through which the processing liquid sent from the tank 6 is circulated to the tank 6. The processing liquid supplying system includes the circulation heater 51 which heats the processing liquid flowing through the circulation flow passage 50 up to the circulation temperature higher than a room temperature (for example, 20 to 30° C.) to adjust a temperature of the processing liquid inside the tank 6. The processing liquid supplying system further includes a pump 52 which circulates the processing liquid inside the tank 6 inside the circulation flow passage 50 and also sends it to the fluid box 5.

The processing liquid supplying system includes a circulation valve 53 for opening and closing the circulation flow passage 50, a discharge flow passage 32 which is branched from the circulation flow passage 50, and a primary supply valve 54 which opens and closes the discharge flow passage 32.

The discharge flow passage 32 includes a plurality of discharge flow passages 32 (first discharge flow passage 32A, second discharge flow passage 32B, third discharge flow passage 32C and fourth discharge flow passage 32D) which guide a processing liquid supplied from the circulation flow passage 50 toward the plurality of discharge ports 31 arranged inside the chamber 9 above the substrate W held by the spin chuck 10 and also in-plane of the substrate W in a planar view.

The processing liquid supplying system includes a plurality of flow-meters 55 for detecting a flow rate of the processing liquid flowing inside the plurality of discharge flow passages 32 and a plurality of flow control valves 56 for changing a flow rate of the processing liquid flowing inside the plurality of discharge flow passages 32. The processing liquid supplying system includes the plurality of discharge heaters 57 for heating the processing liquid flowing inside the plurality of discharge flow passages 32, for example, to a desired discharge temperature not less than the circulation temperature and the plurality of supply valves 4 for individually opening and closing the plurality of discharge flow passages 32. The processing liquid supplying system further includes the plurality of discharge valves 28 for individually opening and closing the plurality of discharge flow passages 32 above the substrate W inside the chamber 9. The plurality of discharge valves 28 are arranged above the substrate W and in-plane of the substrate W in a planar view.

The processing liquid supplying system includes a plurality of return flow passages 33 which are individually connected to the plurality of discharge flow passages 32 inside the chamber 9 above the substrate W and also at an upstream position from the plurality of discharge valves 28 and which allow the processing liquid running through the discharge flow passage 32 to flow back to the circulation flow passage 50. The plurality of return flow passages 33 are individually connected to the plurality of discharge flow passages 32 above the substrate W and also in-plane of the substrate W in a planar view. The processing liquid supplying system includes a plurality of return valves 58 for individually opening and closing the plurality of return flow passages 33.

The processing liquid supplying system includes a plurality of short-circuit flow passages 59 which are individually connected to the plurality of discharge flow passages 32 at an upstream position from a connecting position of the discharge flow passage 32 and the return flow passage 33 and also connected to the return flow passage 33, and a plurality of short-circuit valves 60 for individually opening and closing the plurality of short-circuit flow passages 59. The processing liquid supplying system includes a plurality of suction flow passages 61 which are connected to the plurality of return flow passages 33 at an upstream position from the connecting position of the return flow passage 33 and the short-circuit flow passage 59 and a plurality of suction valves 62 for individually opening and closing the plurality of suction flow passages 61. Although not shown in the drawing, a suction device is connected to the downstream site from the suction flow passage 61. The short-circuit flow passage 59, the short-circuit valve 60, the suction flow passage 61 and the suction valve 62 are all installed inside the fluid box 5.

The supply valve 4, the discharge valve 28, the return valve 58 and the suction valve 62 are each one example of the switching unit for switching the processing liquid supplying system between a discharge state, a discharge stop state and a suctioning and removing state. Further, the short-circuit valve 60 is one example of the opening/closing unit for opening and closing the short-circuit flow passage 59.

The processing liquid supplying system includes a cooler 63 for cooling a processing liquid which is allowed to flow back from the plurality of return flow passages 33 and a recovery flow passage 64 for guiding the processing liquid from the cooler 63 to the tank 6. The processing liquid which has been allowed to flow back from the plurality of return flow passages 33 to the cooler 63 is lowered in temperature by the cooler 63 close to a circulation temperature and, thereafter, guided into the tank 6 through the recovery flow passage 64. The cooler 63 may be a water-cooling type unit or an air-cooling type unit or may be a cooling unit of any other type.

Next, a description will be given of the processing liquid supplying system in a discharge stop state that discharge of a processing liquid from the plurality of discharge ports 31 is stopped, with reference to FIG. 1. In FIG. 1, the valves which are opened are indicated in black, and the valves which are closed are indicated in white.

The processing liquid inside the tank 6 is fed by the pump 52 to the circulation flow passage 50. Some of the processing liquid fed by the pump 52 is heated by the circulation heater 51 and, thereafter, returned to the tank 6 through the circulation flow passage 50. A remaining part of the processing liquid fed by the pump 52 flows through the circulation flow passage 50 into the plurality of discharge flow passages 32. The processing liquid supplied to the discharge flow passage 32 is heated by the discharge heater 57 and, thereafter, fed to a connecting position with the return flow passage 33 in the vicinity of the discharge port 31 arranged inside the chamber 9, and allowed to flow back from the connecting position through the return flow passage 33 to the tank 6.

In the above-described discharge stop state, the processing liquid can be continuously circulated through the plurality of discharge flow passages 32 and the return flow passages 33 individually connected thereto. Thereby, the processing liquid inside each of the discharge flow passages 32 can be maintained at a desired high temperature up to the connecting position with the return flow passage 33 in the vicinity of the discharge port 31 arranged inside the chamber 9 above the substrate W and also in-plane of the substrate W in a planar view.

Next, the processing liquid supplying system in a discharge state that a processing liquid is discharged from the plurality of discharge ports 31 will be described with reference to FIG. 2. In FIG. 2 as well, the valves which are opened are indicated in black and the valves which are closed are indicated in white.

A processing liquid inside the tank 6 is fed by the pump 52 to the circulation flow passage 50. The processing liquid fed by the pump 52 is heated by the circulation heater 51 and, thereafter, flows from the circulation flow passage 50 to the plurality of discharge flow passages 32. The processing liquid supplied to the discharge flow passage 32 is heated by the discharge heater 57 and, thereafter, supplied to the plurality of discharge ports 31 arranged inside the chamber 9.

The processing liquid supplied to the first discharge flow passage 32A is supplied to the single discharge port 31A installed at the first nozzle head 26A. The processing liquid supplied to the second discharge flow passage 32B is supplied to the plurality of discharge ports 31B installed at the second nozzle head 26B. The third discharge flow passage 32C and the fourth discharge flow passage 32D are also similar in configuration to the second discharge flow passage 32B. Thereby, the processing liquid is discharged from all the discharge ports 31.

In the above-described discharge state, each connecting position of the discharge flow passages 32 and the return flow passages 33 can be arranged inside the chamber 9 in the vicinity of the discharge ports 31. Thereby, a downstream portion of the discharge flow passages 32 from each connecting position of the discharge flow passages 32 and the return flow passages 33, that is, from the connecting position of the discharge flow passage 32 and the return flow passage 33 to the discharge port 31, can be made short in distance. Therefore, a processing liquid flowing through the downstream portion of the discharge flow passages 32 from each connecting position of the discharge flow passages 32 and the return flow passages 33 can be made less susceptible to any of thermal effects in association with lowering in temperature on a pipe wall which constitutes the downstream portion. Consequently, it is possible to supply the processing liquid which is accurately adjusted for temperature to a desired high temperature to the substrate W from each of the discharge ports 31.

Further, in the above-described discharge state, it is possible to place the processing liquid discharged from the plurality of discharge ports 31 at a plurality of positions different in distance from the rotation axis A1, while rotating the substrate W around the rotation axis A1. Therefore, the processing liquid which is accurately adjusted for temperature to a desired high temperature can be smoothly fed to an entire area of the upper surface of the substrate W.

Therefore, it is possible to improve uniform processing between the substrates W. It is also possible to improve the uniformity of temperatures of the processing liquid discharged from the plurality of discharge ports and also to improve uniform processing in-plane of the same substrate W.

Next, with reference to FIG. 3, a description will be given of the processing liquid supplying system in a suctioning and removing state in which the processing liquid remaining at a downstream region of the discharge flow passages 32 from a plurality of connecting positions of the discharge flow passages 32 and the return flow passages 33 is sucked and removed. In FIG. 3 as well, valves which are opened are indicated in black, and valves which are closed are indicated in white.

The processing liquid inside the tank 6 is fed by the pump 52 to the circulation flow passage 50. Some of the processing liquid fed by the pump 52 is heated by the circulation heater 51 and, thereafter, returned through the circulation flow passage 50 to the tank 6. A remaining part of the processing liquid fed by the pump 52 flows from the circulation flow passage 50 to the plurality of discharge flow passages 32. The processing liquid supplied to the discharge flow passage 32 is heated by the discharge heater 57 and, thereafter, allowed to flow back to the tank 6 through the short-circuit flow passage 59.

The processing liquid remaining at a downstream region of the discharge flow passages 32 from each connecting position of the discharge flow passages 32 and the return flow passages 33 is sucked and removed into the suction flow passage 61 by a suction force transmitted through the return flow passage 33 from the suction flow passage 61.

Therefore, it is possible to prevent the processing liquid which remains at a downstream region of the discharge flow passages 32 from each connecting position of the discharge flow passages 32 and the return flow passages 33 and which is lowered in temperature from being accidentally supplied from the discharge port 31 to the upper surface of the substrate W in a discharge stop state. Further, it is possible to supply the processing liquid which is accurately adjusted for temperature to a desired high temperature to the substrate W through each of the discharge flow passages 32 upon restarting of discharge of the processing liquid. Consequently, it is possible to further improve uniform processing between the substrates W. It is also possible to improve the uniformity of temperatures of the processing liquid discharged from the plurality of discharge ports and further improve uniform processing in-plane of the same substrate W.

Figure 9:
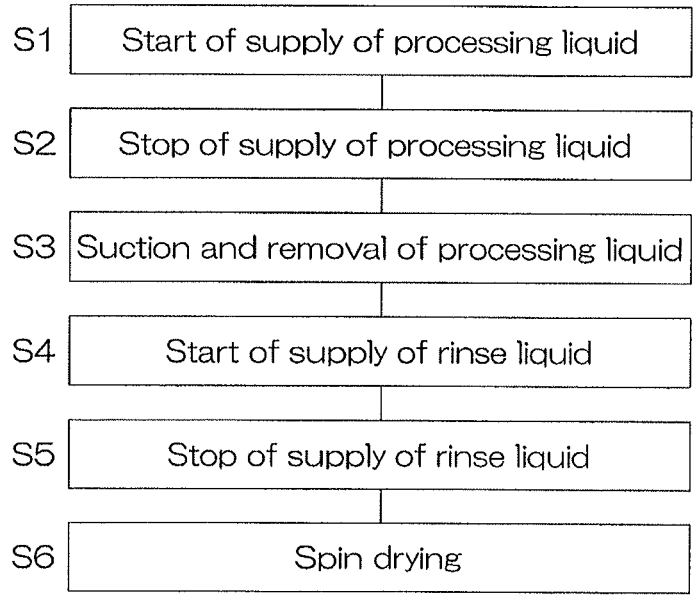
FIG. 9 is a flowchart which shows an example of processing of a substrate executed by the substrate processing apparatus.

FIG. 9 is a flowchart for describing an example of processing of a substrate W executed by the substrate processing apparatus 1.

The controller 3 controls the substrate processing apparatus 1 to execute the following individual operations. Hereinafter, FIG. 2, FIG. 4 and FIG. 5 will be mainly referred to, and FIG. 9 will be referred to, whenever necessary.

When a substrate W is processed by the processing unit 2, in a state that the plurality of nozzles 22 are retracted from above the spin chuck 10 and the splash guard 16 is positioned at a lower position, the substrate W is carried in the chamber 9 by a hand (not illustrated) of a transfer robot. Thereby, the substrate W is placed on the plurality of chuck pins 14 in a state that a front surface thereof is pointed upward. Thereafter, the hand of the transfer robot is retracted from inside the chamber 9, and the carry-in/carry-out port 12a of the chamber 9 is closed by the shutter 12b.

After the substrate W has been placed on the plurality of chuck pins 14, the plurality of chuck pins 14 are pressed to a circumferential edge portion of the substrate W and the substrate W is held by the plurality of chuck pins 14. Further, the guard elevating/lowering mechanism 18 allows the splash guard 16 to move from a lower position to an upper position. Thereby, an upper end of the splash guard 16 is arranged above from the substrate W. Thereafter, the spin motor 15 is driven to start rotation of the substrate W. Thereby, the substrate W is rotated at a predetermined liquid processing speed (for example, several hundred rotations per minute).

Next, the nozzle movement unit 24 allows the plurality of nozzles 22 to move from a stand-by position to a processing position. Thereby, the discharge ports 31 of the plurality of nozzles 22 overlap the substrate W in a planar view. Thereafter, the plurality of discharge valves 28, etc., are controlled to discharge a processing liquid at the same time from the discharge ports 31 of the plurality of nozzles 22 (Step S1 in FIG. 9). The plurality of nozzles 22 discharge the processing liquid from the discharge ports 31 in a state that the nozzle movement unit 24 makes the plurality of nozzles 22 stationary. After the elapse of a predetermined period of time from when the plurality of discharge valves 28 are opened, discharge of the processing liquid from the plurality of discharge ports 31 is stopped at the same time (Step S2 in FIG. 9). Thereafter, the processing liquid remaining inside the discharge flow passage 32 leading to the discharge ports 31 is sucked and removed (Step S3 in FIG. 9). And, the nozzle movement unit 24 moves the plurality of nozzles 22 from the processing position to the stand-by position.

The processing liquid discharged from the discharge ports 31 of the plurality of nozzles 22 is placed on the upper surface of the substrate W in a rotation state and, thereafter, flows outwardly along the upper surface of the substrate W by a centrifugal force (a direction away from the rotation axis A1). The processing liquid which has reached a circumferential edge portion of the upper surface of the substrate W is scattered around the substrate W and received by an inner circumferential surface of the splash guard 16. As described so far, the processing liquid is fed to an entire area of the upper surface of the substrate W, thereby forming a liquid film of the processing liquid covering an entire area of the upper surface of the substrate W. Thereby, an entire area of the upper surface of the substrate W is processed by the processing liquid.

After discharge of the processing liquid has been stopped from the discharge ports 31 of the plurality of nozzles 22, the rinse liquid valve 20 is opened to start discharge of a rinse liquid (pure water) from the rinse liquid nozzle 19 (Step S4 in FIG. 9). Thereby, the processing liquid on the substrate W is washed away by the rinse liquid to form a liquid film of the rinse liquid covering an entire area of the upper surface of the substrate W. After the elapse of a predetermined period of time from when the rinse liquid valve 20 is opened, the rinse liquid valve 20 is closed to stop discharge of the rinse liquid from the rinse liquid nozzle 19 (Step S5 in FIG. 9).

After discharge of the rinse liquid from the rinse liquid nozzle 19 has been stopped, the substrate W is accelerated for rotation in a rotation direction by the spin motor 15 and the substrate W is rotated at a drying speed (for example, several thousand rotations per minute) greater than a liquid processing speed (Step S6 in FIG. 9). Thereby, the rinse liquid adhered on the substrate W is shaken off around the substrate W to dry the substrate W. After the elapse of a predetermined period of time from start of high speed rotation of the substrate W, rotation of the spin motor 15 and the substrate W is stopped.

After rotation of the substrate W has been stopped, the guard elevating/lowering mechanism 18 allows the splash guard 16 to move from an upper position to a lower position. Further, the substrate W held by the plurality of chuck pins 14 is released. In a state that the plurality of nozzles 22 are retracted from above the spin chuck 10 and the splash guard 16 is positioned at the lower position, the transfer robot allows the hand to advance into the chamber 9. Thereafter, the transfer robot picks up the substrate W on the spin chuck 10 by using the hand and carries out the substrate W from the chamber 9.

As described so far, in the present preferred embodiment, in alignment with the discharge port 31 arranged inside the chamber 9 above the substrate W and also in-plane of the substrate W in a planar view, the return flow passage 33 is connected to the discharge flow passage 32 inside the chamber 9 above the substrate W and also in-plane of the substrate W in a planar view. Therefore, in the discharge stop state, the processing liquid can be continuously circulated through the plurality of discharge flow passages 32 and the return flow passages 33 connected individually thereto. Thereby, the processing liquid inside each of the discharge flow passages 32 can be maintained at a desired high temperature up to the connecting position of the discharge flow passages 32 and the return flow passage 33 in the vicinity of the discharge port 31 arranged inside the chamber 9 above the substrate W and also in-plane of the substrate W in a planar view.

Further, in the discharge state, each connecting position of the discharge flow passages 32 and the return flow passages 33 can be arranged inside the chamber 9 above the substrate W and also in the vicinity of the discharge port 31 in-plane of the substrate W in a planar view. Thereby, the downstream portion of the discharge flow passages 32 from each connecting position of the discharge flow passages 32 and the return flow passages 33, that is, from the connecting position of the discharge flow passages 32 and the return flow passage 33 to the discharge port 31, can be made short in distance. Therefore, the processing liquid flowing through the downstream portion of the discharge flow passages 32 from each connecting position of the discharge flow passages 32 and the return flow passages 33 can be made less susceptible to any thermal effects in association with lowering in temperature on a pipe wall which constitutes the downstream portion. Therefore, it is possible to supply the processing liquid which is accurately adjusted for temperature to a desired high temperature to the substrate W from each of the discharge ports 31.

Further, in the discharge state, it is possible to place the processing liquid discharged from the plurality of discharge ports 31 at a plurality of positions different in distance from the rotation axis A1 while rotating the substrate W around the rotation axis A1. Therefore, the processing liquid which is accurately adjusted for temperature to a desired high temperature can be smoothly fed to an entire area of the upper surface of the substrate W.

Consequently, it is possible to improve uniform processing between the substrates W. It is also possible to improve the uniformity of temperatures of the processing liquid discharged from the plurality of discharge ports and also to improve uniform processing in-plane of the same substrate W.

And, therefore, it is possible to omit execution of a predispensing process in which, prior to actual discharge, a processing liquid which is adjusted for temperature to a desired high temperature is supplied to the discharge flow passage 32 and discharged from the discharge port. Alternatively, it is also possible to suppress extension of processing time resulting from execution of the predispensing process and an increase in consumption of the processing liquid by shortening time for discharging the processing liquid in the predispensing process or decreasing an amount of the processing liquid to be discharged.

Further, in the present preferred embodiment, the processing liquid remaining at a downstream region of the discharge flow passage 32 from a connecting position of the discharge flow passage 32 and the return flow passage 33 can be sucked and removed into the suction flow passage 61 by a suction force transmitted from the suction flow passage 61 through the return flow passage 33.

Therefore, the processing liquid which remains at a downstream region of the discharge flow passages 32 from each connecting position of the discharge flow passages 32 and the return flow passages 33 and which is lowered in temperature can be prevented from being accidentally supplied from the discharge ports 31 to the upper surface of the substrate W in a discharge stop state. Further, it is possible to supply the processing liquid which is accurately adjusted for temperature to a desired high temperature to the substrate W through each of the discharge flow passages 32 upon restarting of discharge of the processing liquid. Consequently, it is possible to further improve uniform processing between the substrates W. It is also possible to improve uniformity of temperatures of the processing liquid discharged from the plurality of discharge ports and further improve uniform processing in-plane of the same substrate W.

Although a description has been so far given of the embodiment of the present invention, the present invention shall not be limited thereto and may be modified in various ways within a scope of the present invention.

For example, in the preferred embodiment described above, a description has been given of a case where the number of nozzles 22 is four. However, the number of nozzles 22 may be one or three or may be five or more.

In the preferred embodiment described above, a description has been given of a case where the processing liquid is discharged from the discharge ports 31 of the plurality of nozzles 22 while the plurality of nozzles 22 are made stationary. However, with the number of nozzles 22 given as one, a processing liquid may be discharged from a discharge port 31 of a single nozzle 22, while the single nozzle 22 is made stationary. Further, while one or a plurality of nozzles 22 are allowed to move rotationally (scan) around the nozzle rotational movement axis A2, a processing liquid may be discharged from a discharge port 31 of the single nozzle 22 or discharge ports 31 of the plurality of nozzles 22.

In the preferred embodiment described above, a description has been given of a case where no base 34 is installed at the first nozzle head 26A but the base 34 is installed at all the nozzle heads 26 other than the first nozzle head 26A. However, the base 34 may be installed at all the nozzle heads 26 including the first nozzle head 26A. In contrast, no base 34 may be installed at any of the nozzle heads 26.

In the preferred embodiment described above, a description has been given of a case where three discharge ports 31 are formed on the single base 34. However, the number of discharge ports 31 formed on the single base 34 may be two or may be four or more.

In the preferred embodiment described above, a description has been given of a case where the plurality of discharge ports 31 are arrayed in the radial direction Dr in a planar view. However, as long as the plurality of discharge ports 31 are individually arranged at a plurality of positions different in distance from the rotation axis A1, the plurality of discharge ports 31 may not be arrayed in the radial direction Dr in a planar view.

In the preferred embodiment described above, a description has been given of a case where the plurality of discharge ports 31 are installed above the substrate W and also in-plane of the substrate W in a planar view to discharge the processing liquid in a discharge direction vertical to the upper surface of the substrate W. However, as long as the return flow passage 33 is connected to the discharge flow passage 32 inside the chamber 9, the discharge port 31 may be arranged inside the chamber 9 above the substrate W and also out of a plane of the substrate W in a planar view, thereby discharging the processing liquid obliquely downward with respect to the upper surface of the substrate W.

In the preferred embodiment described above, a description has been given of a case where all the discharge valves 28 are opened at the same time and all the discharge valves 28 are closed at the same time. However, the controller 3 may control the plurality of discharge valves 28 so that, for example, a period of time during which an outer discharge port 31 discharges the processing liquid is longer than a period of time during which an inner discharge port 31 discharges the processing liquid.

In the preferred embodiment described above, a description has been given of a case where the discharge heater 57 is installed on all the discharge flow passages 32. However, for example, the discharge heater 57 is not installed on the first discharge flow passage 31A but the discharge heater 57 may be installed on all the discharge flow passages 32 other than the first discharge flow passage 32A. Further, no discharge heater 57 may be installed on any of the discharge flow passages 32.

The discharge heater 57 includes, for example, a thermoelectric element such as a Peltier device, a resistance heater, an induction heater, and other various types of heaters capable of heating a processing liquid which flows through the discharge flow passage 32.

The controller 3 may control a temperature of the processing liquid supplied to each portion of the front surface of the substrate W for each of a plurality of positions different in distance from the rotation axis A1 within the upper surface of the substrate W, thereby attaining uniform processing. Specifically, the controller 3 may control the plurality of discharge heaters 57 so that temperatures of the processing liquid at the plurality of discharge flow passages 32 are raised with an increase in distance from the rotation axis A1.

Each portion of the substrate W is accelerated in circumferential speed with an increase in distance from the rotation axis A1. A processing liquid on the substrate W is cooled more easily as the circumferential speed is accelerated. Further, on the assumption that the upper surface of the substrate W can be divided into a plurality of circular shaped regions at an equal interval along the radial direction Dr, an area of each of the regions is increased with an increase in distance from the rotation axis A1. The larger the surface area becomes, the more heat moves easily from the processing liquid to the circular shaped regions.

However, temperatures of the processing liquid discharged from the discharge ports 31 are controlled so as to be raised with an increase in distance from the rotation axis A1, by which influences of cooling and heat transfer can be excluded to further improve uniform processing.

The controller 3 may also control a temperature of the processing liquid supplied to each portion of the front surface of the substrate W, according to the thickness of a thin film before processing which formed on the front surface of the substrate W, thereby making uniform the thickness of the thin film after processing.

Specifically, the controller 3 may control the plurality of discharge heaters 57 so that temperatures of the processing liquid at the plurality of discharge flow passages 32 can be made into temperatures corresponding to the thickness of the thin film formed on the front surface of the substrate W before processing.

In this case, a relatively high-temperature processing liquid is supplied to a site relatively large in film thickness before processing, and a relatively low-temperature processing liquid is supplied to a site relatively small in film thickness before processing. The thin film formed on the front surface of the substrate W is relatively increased in etching amount at a site at which the high-temperature processing liquid is supplied and relatively decreased at a site at which the low-temperature processing liquid is supplied. Therefore, the thin film after processing is made uniform in thickness.

Two or more of all the above-described configurations may be combined. Further, two or more of all the above-described processes may be combined.

The present application corresponds to Japanese Patent Application No. 2017-060047 filed in Japan Patent Office on Mar. 24, 2017, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
   a substrate holding unit holding a substrate horizontally;
   a chamber housing the substrate holding unit; and
   a processing liquid supplying system including a circulation flow passage, a discharge flow passage, a discharge port, a return flow passage, a short-circuit flow passage and a suction flow passage, supplying a processing liquid to the substrate held by the substrate holding unit;
   the circulation flow passage circulates the processing liquid and has a circulation heater which maintains the processing liquid at a predetermined temperature not less than a room temperature,
   the discharge flow passage branched from the circulation flow passage guides the processing liquid supplied from the circulation flow passage toward the discharge port,
   the discharge port is arranged inside the chamber to discharge the processing liquid supplied through the discharge flow passage to the substrate held by the substrate holding unit,
   the return flow passage is connected to the discharge flow passage inside the chamber, allowing the processing liquid running through the discharge flow passage to return to the circulation flow passage,
   the short-circuit flow passage is connected to the discharge flow passage at an upstream position from a connecting position of the discharge flow passage and the return flow passage and connected to the return flow passage,
   the suction flow passage is connected to the return flow passage at a position downstream from a connecting position of the return flow passage and the discharge flow passage, and upstream from a connecting position of the return flow passage and the short-circuit flow passage, thereby transmitting a suction force through the return flow passage to a downstream region of the discharge flow passage at a connecting position of the discharge flow passage and the return flow passage, and the processing liquid supplying system further includes an opening/closing unit for opening and closing the short-circuit flow passage;
wherein the circulation flow passage, the discharge flow passage, the return flow passage, the short-circuit flow passage and the suction flow passage each have respective valves, said valves having open and closed positions, and the respective valves are switchable to provide:
   a small circuit comprised of the circulation flow passage;
   a large circuit extending to the discharge port, comprised of the circulation flow passage, the discharge flow passage and the return flow passage; and
   a medium circuit comprised of the circulation flow passage, the discharge flow passage, the short-circuit flow passage and the return flow passage.

2. The substrate processing apparatus according to claim 1, wherein the discharge port is arranged inside the chamber above the substrate held by the substrate holding unit and in-plane of the substrate in a planar view, and the return flow passage is connected to the discharge flow passage inside the chamber above the substrate and in-plane of the substrate in a planar view.

3. The substrate processing apparatus according to claim 1, wherein the processing liquid supplying system further includes a discharge heater, and
   the discharge heater is placed on the discharge flow passage at an upstream position from a connecting position of the discharge flow passage and the return flow passage to heat the processing liquid flowing through the discharge flow passage.

4. The substrate processing apparatus according to claim 1, wherein the processing liquid supplying system includes a plurality of discharge flow passages branched from the circulation flow passage, and a plurality of discharge ports installed on respective ones of the plurality of discharge flow passages, and a plurality of return flow passages connected individually inside the chamber to respective ones of the plurality of discharge flow passages.

5. The substrate processing apparatus according to claim 4, wherein the substrate holding unit rotates the substrate around a vertical rotation axis passing through a central portion of the substrate, and the plurality of discharge ports are arranged inside the chamber at a plurality of positions different in distance from the rotation axis within an upper surface of the substrate.

6. The substrate processing apparatus according to claim 1, wherein the processing liquid supplying system further includes a switching unit, and
   the switching unit switches to any of a plurality of states including a discharge state in which a processing liquid supplied from the circulation flow passage to the discharge flow passage is supplied to the discharge port and a discharge stop state in which the processing liquid supplied from the circulation flow passage to the discharge flow passage is supplied to the return flow passage.

7. The substrate processing apparatus according to claim 1, wherein the processing liquid supplying system further includes a switching unit, and
   the switching unit switches to a suctioning and removing state in which, in a state that the short-circuit flow passage is opened by the opening/closing unit to short-circuit and connect the discharge flow passage to the return flow passage through the short-circuit flow passage, a suction force is transmitted to a downstream region of the discharge flow passage from a connecting position of the discharge flow passage and the return flow passage, through the suction flow passage and the return flow passage, and the processing liquid inside the region is sucked and removed into the suction flow passage.

\* \* \* \* \*